(12) United States Patent
Babcock et al.

(10) Patent No.: US 7,470,968 B2
(45) Date of Patent: Dec. 30, 2008

(54) T-COIL APPARATUS AND METHOD FOR COMPENSATING CAPACITANCE

(75) Inventors: Douglas W. Babcock, Manchester, NH (US); Robert A. Duris, Hubbardston, MA (US); Bruce Hecht, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 418 days.

(21) Appl. No.: 11/325,882

(22) Filed: Jan. 4, 2006

(65) Prior Publication Data

US 2006/0109023 A1 May 25, 2006

Related U.S. Application Data

(62) Division of application No. 10/722,970, filed on Nov. 25, 2003, now Pat. No. 7,248,035.

(60) Provisional application No. 60/433,248, filed on Dec. 12, 2002.

(51) Int. Cl.
*H01L 27/08* (2006.01)

(52) U.S. Cl. .............................. 257/531; 257/E21.575; 257/566; 257/578; 257/728; 324/158.1; 324/763; 324/765

(58) Field of Classification Search ............... 324/158.1, 324/765, 763, 73.1, 679; 714/724–733; 257/728; 257/E21.575, E23.02, 531, 566, 578, 583; 438/14–17; 333/130, 246; 702/105–107, 702/85

See application file for complete search history.

(56) References Cited

U.S. PATENT DOCUMENTS

| | | | | | |
|---|---|---|---|---|---|
| 5,233,310 | A | * | 8/1993 | Inoue | 330/277 |
| 5,519,582 | A | * | 5/1996 | Matsuzaki | 361/783 |
| 5,568,516 | A | * | 10/1996 | Strohallen et al. | 375/259 |
| 5,929,722 | A | * | 7/1999 | Kono | 333/177 |
| 5,994,759 | A | * | 11/1999 | Darmawan et al. | 257/538 |
| 6,118,985 | A | * | 9/2000 | Kawakyu et al. | 455/78 |
| 6,310,387 | B1 | * | 10/2001 | Seefeldt et al. | 257/531 |
| 6,463,395 | B1 | | 10/2002 | Iorga | 702/107 |
| 6,495,912 | B1 | * | 12/2002 | Huang et al. | 257/700 |
| 6,642,707 | B1 | | 11/2003 | Iorga et al. | 324/158.1 |
| 6,734,759 | B2 | | 5/2004 | Humann | 333/167 |
| 6,801,621 | B1 | | 10/2004 | Tennen et al. | 379/345 |

(Continued)

OTHER PUBLICATIONS

Three technologies on one chip make a broadband amplifier + "T" coil, by John Addis, Tektronix Inc., Beaverton, Ore., Electronics/Jun. 5, 1972.

(Continued)

*Primary Examiner*—Chris C. Chu
(74) *Attorney, Agent, or Firm*—Koppel, Patrick, Heybl & Dawson

(57) ABSTRACT

A passive matching network is connected to an input/output line for an automatic test equipment drive channel to compensate for capacitances associated with a receiver circuit connected to the line, and also an optional current-mode driver circuit. The matching circuit preferably comprises a T-coil circuit that can include a bridging capacitor; separate T-coil circuits can be provided to separately compensate for receiver circuit and current-mode driver circuit capacitances. The driver and receiver circuits can be implemented on a common layer of an integrated circuit, with the T-coil windings implemented in a separate layer of the same integrated circuit that is spaced from the common layer by at least one dielectric layer.

18 Claims, 4 Drawing Sheets

U.S. PATENT DOCUMENTS 7,102,462 B2 * 9/2006 Taniguchi et al. ........... 333/133
7,176,546 B2 * 2/2007 Ahrens et al. ................ 257/458
7,248,035 B2 * 7/2007 Babcock et al. .......... 324/158.1

OTHER PUBLICATIONS

Modified T-coil Network, Jim Hagerman, Hughes-JVC Technology Corp., 2310 Camino vida Roble, Carlsbad, CA 92009; Internet: 72230.1740@compuserve.com, Sep. 12, 1995.

Small-Signal MMIC Amplifiers with Bridged T-Coil Matching Networks, L. Selmi, D.B Estreich, and B. Ricco, IEEE Journal of Solid-State Circuits, vol. 27, No. 7, Jul. 1992, 0018-9200/92$03.00 © 1992 IEEE.

Good Engineering and Fast Vertical Amplifiers, John Addis, Analog Circuit Design, Butterworth-Heineman, pp. 107-122, 1991.

* cited by examiner

T-COIL APPARATUS AND METHOD FOR COMPENSATING CAPACITANCE

RELATED APPLICATION

This application is a divisional of Ser. No. 10/722,970, filed Nov. 25, 2003, now U.S. Pat. No. 7,248,035 which claims the benefit of provisional application Ser. No. 60/433,248, filed Dec. 12, 2002.

BACKGROUND OF THE INVENTION

1. Field of the Invention

This invention relates to T-coil structures and fabrication methods, and their use in automatic test equipment (ATE).

2. Description of the Related Art

ATE systems employ drive channels for applying test signals to a device under test (DUT), and comparator circuits for receiving signals back from the DUT and comparing them to a threshold to determine the DUT's response. Drive circuits can include voltage mode drivers, in which a dynamically varied voltage signal is generated directly for application to the DUT, current mode drivers in which a dynamically varied current is generated and directed through a resistor to a constant voltage reference to generate a dynamically varying voltage signal on the other side of the resistor for application to the DUT, and combinations of the two. An example of a combination of both types of drivers is provided in U.S. Pat. No. 6,292,010.

Such circuits have associated capacitances that reduce their bandwidth and speed. Contributors to the overall capacitance include collector-base and collector-substrate capacitances of the output transistors in current mode drivers, the capacitance of the cable that connects the circuits to the DUT, and capacitances associated with metal runs and bond pads on the comparator circuit.

Prior attempts to eliminate or compensate for these capacitances have included designing class AB drivers to be faster than necessary, and then adding filters to compensate for the driver's capacitance. This makes the driver unusable for the upper end of its design speed, and also lowers the performance of the comparator. Separate cables have also been provided for transmitting the drive signal to the DUT and directing the DUT's response at pin to the comparators. This requires an additional cable for each drive channel, and also requires the driver circuitry and comparators to be provided on separate chips. Considering that typical ATE systems can have hundreds of drive channels, the additional expense and space required can be significant.

An "inductive peaking" technique has also been moved used, in which the driver output bond pad was moved so as to increase the bond wire length and thereby increase the circuit's effective inductance. This at least partially compensated parasitic capacitance to boost the circuit output. However, its compensation effect was limited, since it provided compensation only for transmitted drive signals but not for DUT response signals.

SUMMARY OF THE INVENTION

The present invention in one embodiment seeks to compensate for such capacitances with a bidirectional ATE drive channel having an input/output line for connection to a DUT, a driver circuit connected to apply test signals to the input/output line for application to a DUT, a receiver circuit connected to the line to receive signals produced by the DUT, with the receiver circuit having an associated capacitance, and a passive matching network, preferably a T-coil circuit, connected to the line to at least partially compensate for the capacitance associated with the receiver circuit. The driver and receiver circuits can be implemented on a common layer of an integrated circuit (IC), with the T-coil circuit on a layer of the IC that is spaced from the common layer by at least a dielectric layer. When both current-mode and voltage-mode drivers are used, a second passive matching network, preferably a second T-coil circuit, can be connected in series with the first matching network to at least partially compensate for the current-mode driver capacitance. Although a primary application for the invention is bidirectional ATE channels, it is also applicable to receive only channels.

In an IC structure having a dielectric layer over a circuit layer, the T-coil circuit can be provided over the dielectric layer and connected to the circuit layer by electrically conductive connectors that extend through the dielectric layer. In doing so, the T-coil circuit can be connected to the circuit layer via a metallization network that itself overlies the circuit layer and makes electrical contact therewith through a second dielectric layer. External connections can be made via a flip-chip bump that is connected to the circuit layer and has an associated redistribution layer on the same level as the T-coil circuit.

A completed receiver circuit having an unwanted capacitance can first be fabricated, followed by the provision of a dielectric layer over the circuit, forming a T-coil circuit on the dielectric layer, and connecting the T-coil circuit through the dielectric layer to the circuit to at least partially compensate the capacitance.

These and other features and advantages of the invention will be apparent to those skilled in the art from the following detailed description, taken together with the accompanying drawings.

DETAILED DESCRIPTION OF THE INVENTION

Figure 1:
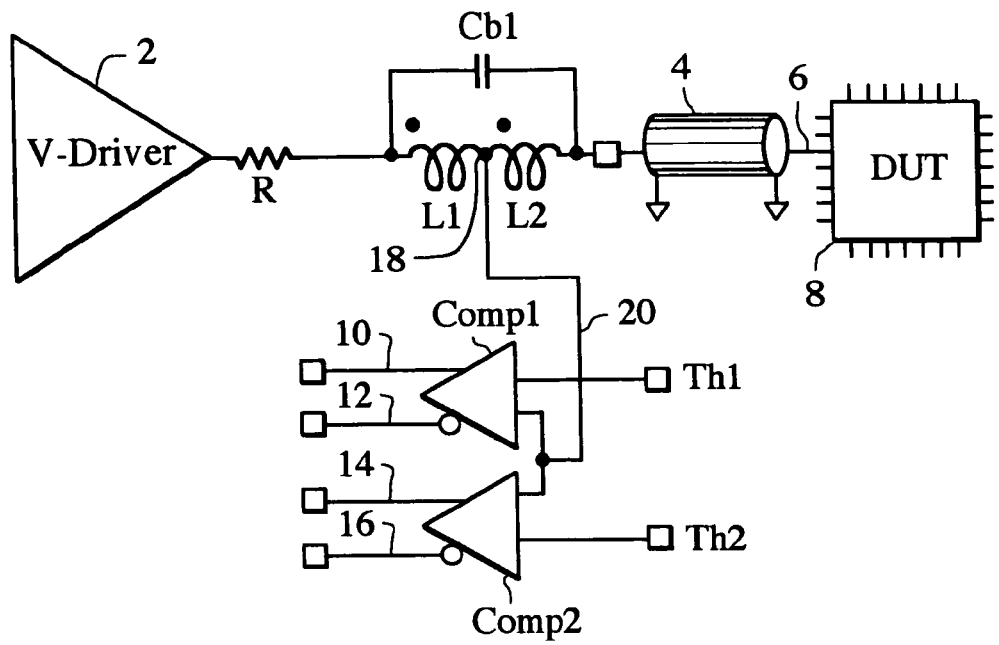
FIG. 1 is a simplified schematic diagram of an ATE channel, including a voltage-mode driver circuit, receive comparators, and a capacitance compensating T-coil in accordance with the invention.

A bidirectional ATE drive channel to which the invention is applicable is shown in FIG. 1. A voltage-mode driver 2 operates under the control of a pattern generator (not shown) to produce a series of voltage drive signals in the form of pulses at the output of a series resistor R. The pulses are transmitted through a connector cable 4 to an input/output pin 6 of a DUT 8, with the leading edges of the pulses normally providing triggers for the DUT.

The DUT generates a response at the same pin 6, and the response is transmitted back through cable 4 to respective inputs of a pair of comparators COMP1 and COMP2. The other comparator inputs are connected to respective threshold voltage levels Th1 and Th2, with Th1 greater than Th2. COMP1 has complementary outputs 10, 12, while COMP2 has complementary outputs 14, 16. When the signal returned from the DUT is within the window between Th1 and Th2 (less than Th1 but greater than Th2), both comparators will produce a positive output.

In accordance with one aspect of the invention, a passive matching network, preferably a T-coil circuit is inserted at the junction of resistor R, cable 4 and the comparators. The T-coil circuit consists of a first inductor L1 connected between resistor R and node 18, a second inductor L2 connected between node 18 and cable 4, and a line 20 connecting node 18 to the common input to COMP1 and COMP2. An optional bridging capacitor Cb1 is also shown connected between the opposite ends of L1 and L2. These inductors are also coupled to one another by some degree of mutual inductance. The bridging capacitor allows high frequency energy to flow from the voltage-mode driver 2 to the cable 4 while the inductors are charging, thereby enabling circuit operation during this initial period, and also enables a bidirectional improvement in bandwidth that applies to both test signals sent to the DUT, and to DUT response signals returned to the comparators.

T-coil circuits per se have been used previously in oscilloscope front-end amplifiers. An example is given in John Addis "Good Engineering and Fast Vertical Amplifiers", chapter in *Analog Circuit Design* Butterworth-Heineman, pages 107-122, 1991. However, they have not previously been proposed for use in ATE drive circuitry, despite the disadvantages of driver filters, separate driver and comparator cables, and inductive peaking arrangements that have been known for a considerable period of time.

Figure 2:
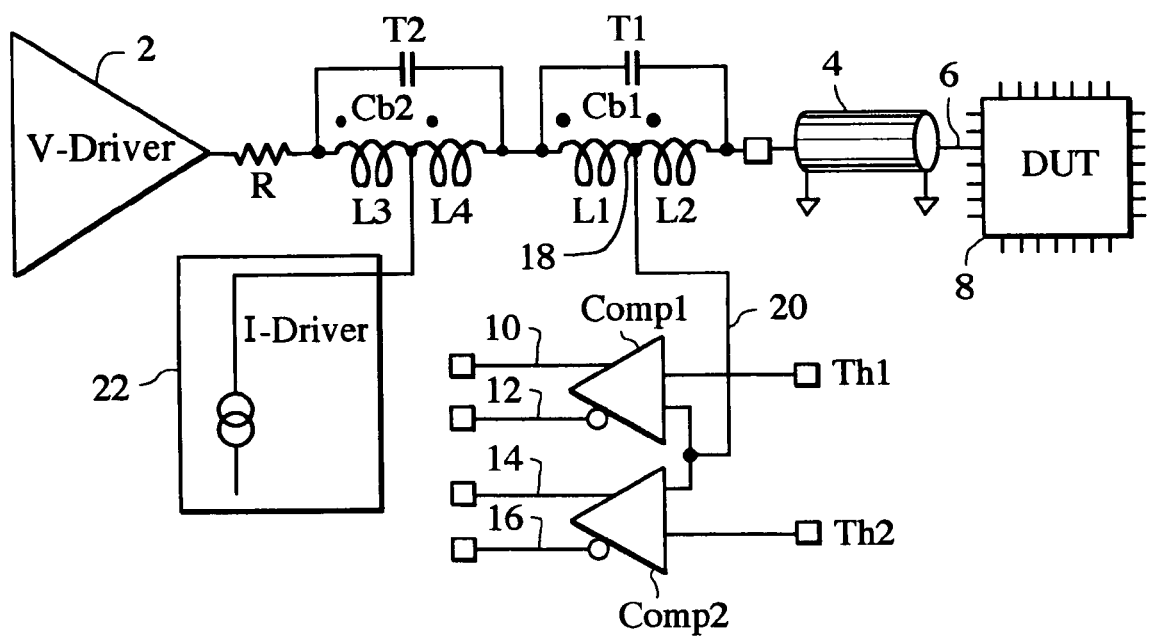
FIG. 2 is a simplified schematic diagram of the ATE drive channel shown in FIG. 1, to which a current-mode driver and a second compensating T-coil have been added.

In FIG. 2 a current-mode driver 22 has been added to the circuit of FIG. 1. When operated in current mode, a constant voltage is maintained at the output of the voltage-mode driver 2, and a dynamic current is drawn by the current driver 22 through resistor R, producing a dynamically varying voltage drive signal on the side of R towards the transmission cable 4. In this circuit, in addition to the T-coil T1 for the comparators, a second T-coil circuit T2 is added to compensate for the unwanted capacitance associated with the current-mode driver 22, which is typically larger than the comparator capacitance, and to keep the current mode driver 22 from loading down the comparator circuits. T-coil T2 consists of a pair of inductor coils L3 and L4 connected in series between resistor R and the comparator T-coil circuit T1, along with an optional bridge capacitor Cb2 between the ends of coils L3 and L4.

As indicated by the dotting convention used in the figures, the individual coils of each T-coil circuit are connected in series. The coils are also fabricated in proximity to each other so that they mutually couple. The out-of-phase mutual coupling between L3 and L4, together with the T2 bridging capacitor Cb2, produces an effective negative inductance between current-node driver 22 and T2 that balances the inductances of the coils to allow current to flow from the current-mode driver through resistor R during high frequency operation.

Figure 3:
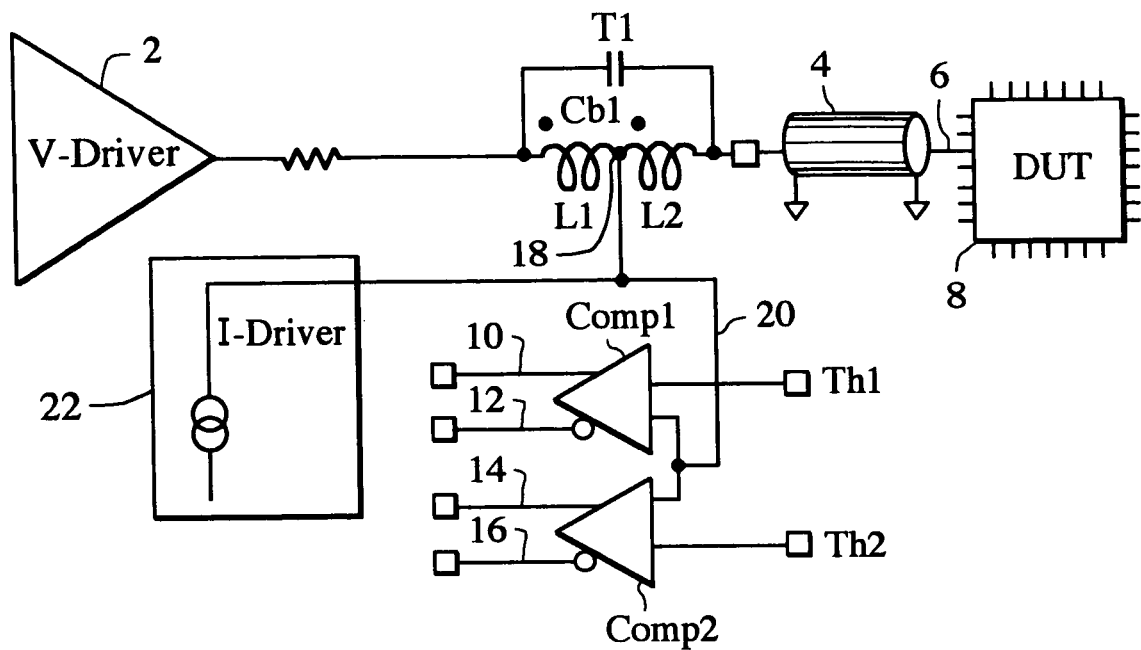
FIG. 3 is a simplified schematic diagram of an ATE drive channel similar to that of FIG. 2, but with only a single T-coil circuit.

FIG. 3 illustrates another drive channel with a current-mode driver, but with only one T-coil T1. The values of the T-coil inductors would be adjusted to account for the capacitances of both the current mode driver 22 and the comparators. This does not achieve all the benefits of the dual T-coil circuit of FIG. 2, in which the capacitance of the current-mode driver in the transmit mode is isolated from the comparators. However, it still achieves a better operation than the prior inductive peaking approach.

The invention is also applicable to conventional receive only, rather than bidirectional, ATE channels. In this application a drive signal is delivered to a given DUT input/output pin along one cable, and the DUT response at that pin is transmitted to the comparator circuit over a separate cable. Alternatively, the drive signal could be transmitted to one DUT pin, and the DUT response taken from a different DUT pin, which could be an output only pin. The arrangement could be the same as in FIG. 1, except instead of the voltage driver 2, coil L1 of the T-coil circuit would be terminated by a (typically 50 ohm) termination resistor to ground. In this application the T-coil would both reduce the input capacitance to the comparators, and improve the received signal bandwidth.

Figure 4A:
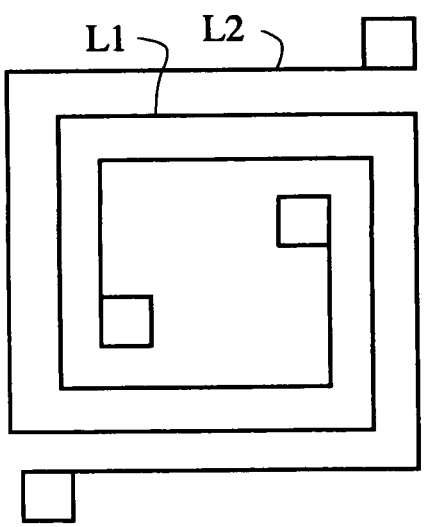
FIGS. 4a and 4b are plan views of possible T-coil configurations that could be used.
Figure 4B:
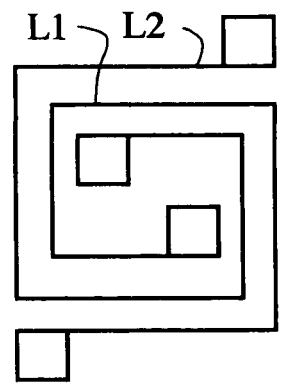

FIGS. 4a and 4b illustrate 2 possible layouts for the T-coil inductors, with L1 and L2 interleaved in forming 1½ turns in FIG. 4a and 1¼ turns in FIG. 4b. In these embodiments, the 2 coils effectively form a transformer, with a current change in one coil inducing a current in the other coil. The coils could also be separated, but the provision of a mutual coupling between coils is helpful in enabling a current flow from a current mode driver through the resistor R at high frequencies. A perfect T-coil would have a characteristic impedance that is bidirectional and matches R at any frequency. As an alternate to concentric coils, the 2 coils could be vertically stacked in proximity to each other to provide mutual coupling.

Figure 5:
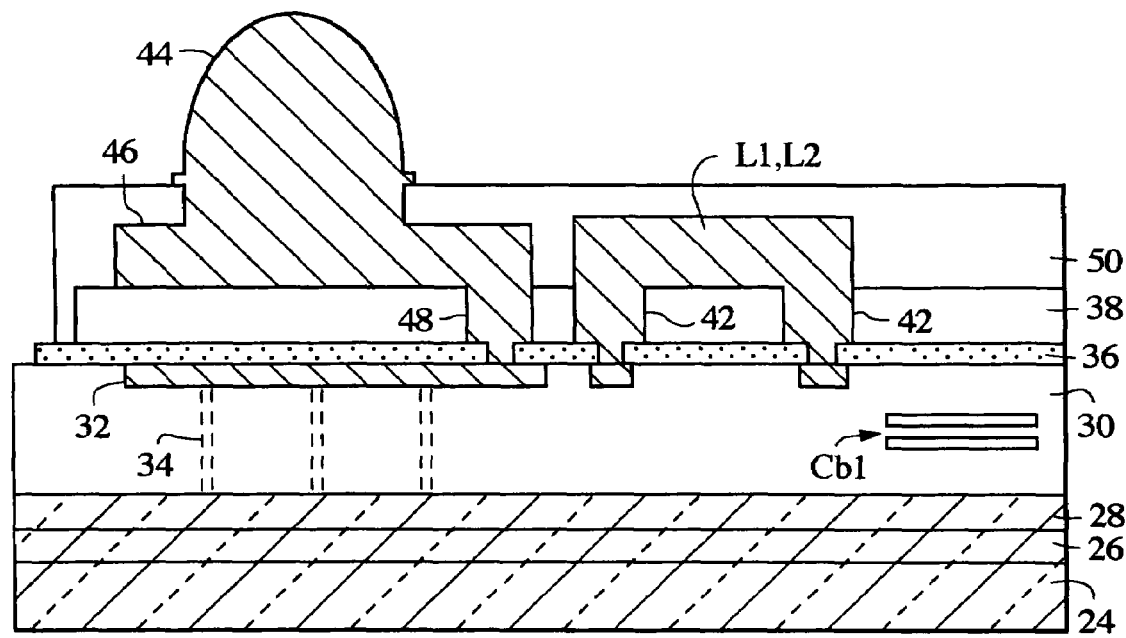
FIG. 5 is a sectional view illustrating a possible circuit structure, including a flip-chip connector bump, with a t-coil compensating capacitance associated with the underlying circuit.
Figure 6:
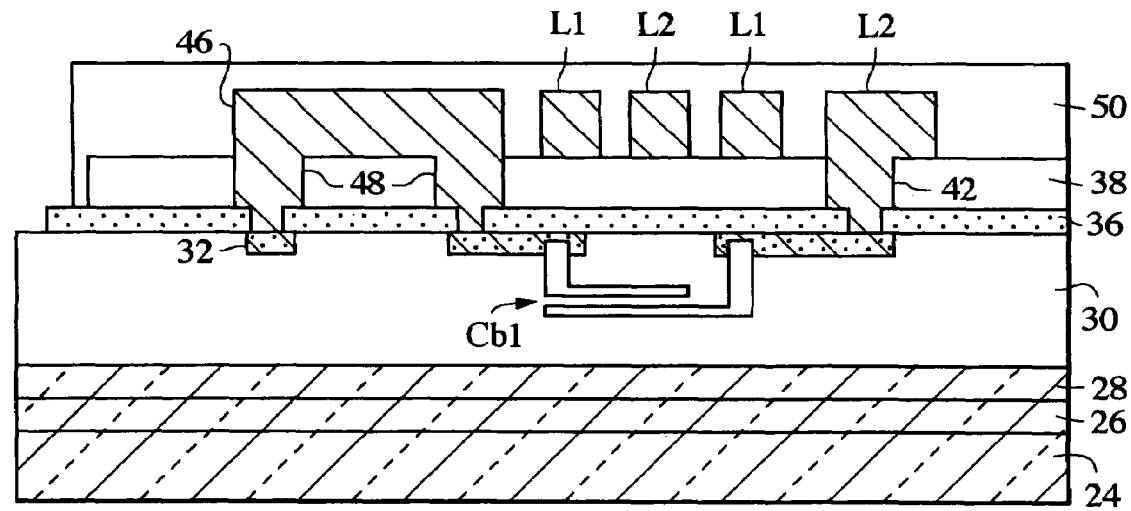
FIG. 6 is a sectional view of the structure of FIG. 5, taken at a 90° angle to FIG. 5.

One illustrative implementation of the T-coil is illustrated in FIGS. 5 and 6. FIG. 5 is taken along a section line that extends along one section of the coil legs of FIG. 4a or 4b, whereas FIG. 6 is taken along a section line at a right angle that cuts through coil arm sections. In this example, the driver circuitry (if used) and comparator circuitry are formed first and coated with a passivation layer, and the T-coil inductors are then formed on a dielectric layer that overlies the passivation layer. This is advantageous compared to the practice for oscilloscope front-end amplifiers, in which the T-coil windings are generally implemented in the same layer as the amplifier circuitry. By spacing the T-coil inductors vertically above the remainder of the drive channel circuitry, a greater separation between the coils and the next closest metal layer is achievable, thereby reducing parasitic capacitance and noise. It also reduces eddy current losses associated with energy from the coils being coupled into the substrate for the remainder of the circuit and dissipated as heat.

In the illustration of FIGS. 5 and 6, a substrate 24 such as silicon or glass includes an overlying silicon dioxide layer 26. Next is an epitaxial silicon or other semiconductor layer 28, in which the circuit elements for the drive channel are formed. Another dielectric layer 30, typically an oxide, is formed over the circuit layer 28, with a top metallization layer 32 over the dielectric layer 30. The metallization layer 32 is conventional, consisting of a network of metallic traces that interconnect desired portions of the underlying circuit layer through connector vias 34 (indicated by hidden lines in FIG. 5) that extend through the dielectric layer 30. The vias can be established by forming openings through the passivation layer 36 and dielectric layer 38 in registration with each other and with desired locations on the metallization network 36, depositing a conductive material through the openings to the metallization network and continuing the deposition on top of the dielectric layer 38 to form the T-coil inductor windings in electrical contact with the vias. Multiple metallization layers (not shown), spaced from each other by additional dielectric layers, would normally be provided to enable crossovers between separate locations on the first metallization layer 32. The assembly is capped with a protective passivation layer 36. Up to this point, the fabrication is conventional.

In this implementation of the T-coil, an additional dielectric layer 38 is laid down over the passivation layer 36, with the T-coil inductors L1 and L2 formed over dielectric layer 38 and connected to the metallization layer 32 by vias 42 through the dielectric and passivation layers 38 and 36. A bridging capacitor Cb1, if used, could be placed at various locations, such as within (or with one plate on tope of) the dielectric layer 38 as illustrated in the figures, with its plates in two standard metallization layers for the channel circuitry, or in a dedicated capacitance layer with a thinner dielectric.

In the illustrated embodiment, provision is made for connection of the circuitry to an additional IC chip by means of a conventional flip-chip bump 44. A metal redistribution layer 46 for the bump may be formed lateral to the T-coil windings L1, L2, over dielectric layer 38, and connected to the metallization layer 32 by a via 48 that extends through the dielectric and passivation layers 38 and 36. The T-coil windings and redistribution layer 46 are encapsulated in another dielectric layer 50, with the flip-chip bump 44 extending through an opening formed in the top dielectric layer 50 to contact the redistribution layer. The bump 44 is typically formed from solder over an underlying metal. The redistribution layer 46 establishes an electrical connection between the bump 44 and via 48, allowing the bump to be laterally offset from the via for alignment with a corresponding bump on the chip to which the assembly is to be connected.

Figure 7:
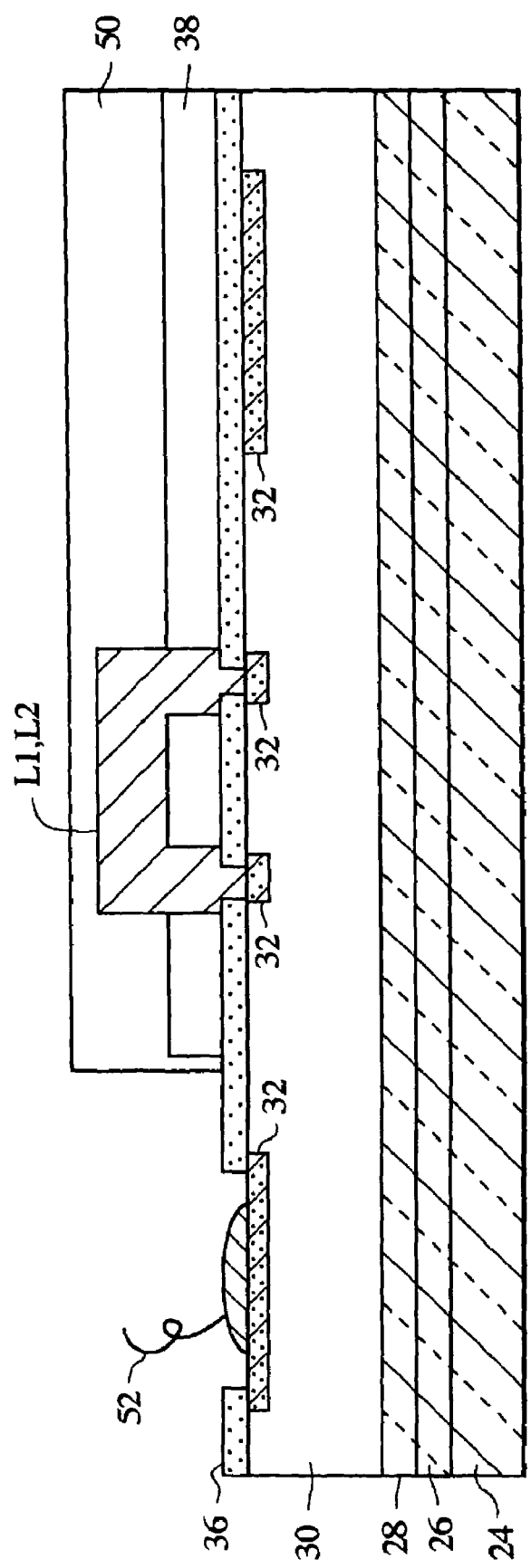
FIG. 7 is a sectional view of a T-coil compensated circuit structure, but with a wire bond rather than a flip-chip connector.

FIG. 7 illustrates a variation on the circuit structure of FIGS. 5 and 6, with an external connection to the channel circuitry made by a wire bond connection 52 rather than a flip-chip bump. The wire bond is formed at a desired location of the metallization layer 32 through an opening in passivation layer 36.

While fabricating the T-coil inductors on the same chip as the remainder of the driver channel circuitry, but spaced above that circuitry, is advantageous in terms of reducing parasitic capacitances and other losses, the T-coil circuit could also be fabricated in other ways. These include fabricating it on the same level as the remainder of the driver channel circuitry, or forming it on its own substrate such as alumina, glass, ceramic or silicon, and using a technique such as flip-chip bonding or wire bonding to connect the T-coil IC to the active circuit IC. The T-coils could also be formed in other ways, such as coupled wires that could be bond wires, or on a printed wire board such as a circuit board with copper T-coils on an organic laminate.

The invention as described offers distinct advantages over prior efforts to compensate for unwanted capacitances in the driver channel. It makes possible a greater bandwidth and higher frequency operation, while eliminating the need for extra external components since the matching networks can be included on the same chip as the driver circuitry. Including the matching networks on-chip also eliminates the need to bring out each block's signals on separate bond pads, thus making it possible to reduce the overall bondpad count compared to prior techniques, and in addition contributing to reduced die size for pad-limited chips. Since the capacitive loading of each driver block is compensated at a nearby location, the overall signal integrity is preserved, while the elimination of filters for the voltage-mode driver eliminates the need for extra power that would be necessary to make the individual driver circuits operate at higher speeds than needed.

The new approach can be applied in a scalable manner to a wide variety of problems. For example, if two driver circuits present capacitive loading, each may be separately compensated with its own matching network. The matching networks can be implemented with processes that are compatible with existing IC technology, and also with conventional IC packaging techniques such as flip-chip and wire bonding.

While particular embodiments of the invention have been shown and described, numerous variations and alternate embodiments will occur to those skilled in the art. Accordingly, it is intended that the invention be limited only in terms of the appended claims.

We claim:

1. A capacitance-compensated integrated circuit package to facilitate test of a device under test (DUT), comprising:
   a substrate,
   a semiconductor circuit layer configured over said substrate to form a signal driver and at least one comparator wherein said driver and said comparator have an associated capacitance,
   a dielectric layer over said semiconductor circuit layer
   a conductive T-coil circuit arranged over said dielectric layer to form interleaved first and second inductors that join at a common node and respectively extend from said common node to terminate in respective first and second ends, and
   electrically conductive vias extending through said dielectric layer to connect said signal driver to said first end and connect said comparator to said common node;
   said second end thus provided to receive said DUT wherein said driver provides signals to said first end and said comparator compares responses at said common node to a threshold and said T-coil circuit at least partially compensates said capacitance.

2. The circuit package of claim 1, further comprising a wire-bond arranged over said dielectric layer to facilitate connection between said second end and said DUT.

3. The circuit package of claim 1, further comprising a flip-chip bump arranged over said dielectric layer to facilitate connection between said second end and said DUT.

4. The circuit package of claim 1, wherein said T-coil circuit includes a bridging capacitor extended into said dielectric layer and coupled between said first and second ends to enhance bandwidth of said test.

5. The circuit package of claim 1, wherein said signal driver is s voltage-mode driver.

6. The circuit package of claim 1, wherein said circuit layer is configured to also form a current-mode driver and said vias extend through said dielectric layer to connect said current-mode driver to said common node.

7. The circuit package of claim 1, wherein said comparator comprises first and second comparators arranged to respectively compare said responses to first and second thresholds.

8. The circuit package of claim 1, wherein said interleaved first and second inductors are arranged to mutually couple to thereby form an effective negative inductance that at least partially compensates said capacitance.

9. The circuit package of claim 1, further including a metallization layer arranged over said dielectric layer to interconnect said vias to said first end and said common node.

10. The circuit package of claim 1, further including a connector cable arranged to couple said DUT to said common node.

11. A capacitance-compensated integrated circuit package to facilitate test of a device under test (DUT), comprising:
   a substrate,
   a semiconductor circuit layer en configured over said substrate to form a voltage-mode driver, a current-mode driver and at least one comparator that have an associated capacitance,
   a dielectric layer over said semiconductor circuit layer,
   a conductive T-coil circuit arranged over said dielectric layer to form interleaved first and second inductors that join at a first common node and interleaved third and fourth inductors that join at a second common node wherein said second inductor connects to said third inductor, and
   electrically conductive vias extending through said dielectric layer to connect said voltage-mode driver to said first inductor, connect said current-mode driver to said first common node, and connect said comparator to said second common node,
   said fourth inductor thus provided to receive said DUT wherein a selected one of said voltage-mode driver and said current-mode driver provides signals to a respective one of said first inductor and said first common node and said comparator compares responses at said second common node to a threshold with said T-coil circuit at least partially compensating said capacitance.

12. The circuit package of claim 11, further comprising a wire-bond arranged over said dielectric layer to facilitate connection between said fourth inductor and said DUT.

13. The circuit package of claim 11, further comprising a flip-chip bump arranged over said dielectric to facilitate connection between said fourth inductor and said DUT.

14. The circuit package of claim 11, wherein said T-coil circuit includes:
   a first bridging capacitor extended into said dielectric layer and coupled across said first and second inductors; and
   a second bridging capacitor extended into said dielectric layer and coupled across said third and fourth inductors;
   said first and second bridging capacitors enhancing bandwidth of said test.

15. The circuit package of claim 11, wherein said comparator comprises first and second comparators arranged to respectively compare said responses to first and second thresholds.

16. The circuit package of claim 11, wherein said interleaved first and second inductors are arranged to mutually couple and said interleaved third and fourth inductors are arranged to mutually couple to thereby form effective negative inductances that at least partially compensates said capacitance.

17. The circuit package of claim 11, further including a metallization layer arranged over said dielectric to interconnect said vias to said first inductor and said first and second common nodes.

18. The circuit package of claim 11, further including a connector cable arranged to couple said DUT to said common node.

* * * * *